US008726223B2

(12) United States Patent
Garnier et al.

(10) Patent No.: US 8,726,223 B2
(45) Date of Patent: May 13, 2014

(54) HOT-PLUGGING DEBUGGER ARCHITECTURES

(71) Applicants: Sylvain Garnier, Nantes (FR); Anthony Rouaux, Mauves sur Loire (FR); Sebastien Jouin, La Chapelle-Launay (FR); Frode Milch Pedersen, Trondheim (NO)

(72) Inventors: Sylvain Garnier, Nantes (FR); Anthony Rouaux, Mauves sur Loire (FR); Sebastien Jouin, La Chapelle-Launay (FR); Frode Milch Pedersen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/624,706

(22) Filed: Sep. 21, 2012

(65) Prior Publication Data

US 2014/0089748 A1    Mar. 27, 2014

(51) Int. Cl.
G06F 17/50    (2006.01)

(52) U.S. Cl.
USPC ........................................... 716/136

(58) Field of Classification Search
USPC ................................. 716/136; 714/25, 30, 31
See application file for complete search history.

(56) References Cited

U.S. PATENT DOCUMENTS 6,094,729 A * 7/2000 Mann .............................. 714/25
2002/0133794 A1* 9/2002 Kanapathippillai et al. ...... 716/4

* cited by examiner

Primary Examiner — Vuthe Siek
(74) Attorney, Agent, or Firm — Fish & Richardson P.C.

(57) ABSTRACT

Systems and techniques for hot-plugging debugger capabilities are described. A described integrated circuit device includes a processor, a first pad interface, a detector configured to detect a clock signal via the first pad interface, one or more second pad interfaces, two or more components including a debug system that is communicatively coupled with the processor, a multiplexer communicatively coupled with the one or more second pad interfaces and the two or more components, and configured to selectively interconnect the one or more second pad interfaces with a selected component of the two or more components. The multiplexer can be configured to cause the debug system to be the selected component when the clock signal is detected via the first pad interface.

20 Claims, 5 Drawing Sheets

HOT-PLUGGING DEBUGGER ARCHITECTURES

TECHNICAL FIELD

This patent document relates generally to debug hardware architectures.

BACKGROUND

Device developers may use hardware debuggers to debug a device. A hardware debugger can use a Joint Test Action Group (JTAG) based interface to gain control of a processor. A debugging application, running on a host device, can connect with the hardware debugger to perform operations such as setting software breakpoints, monitoring processor states, reading data, or writing data to one or more locations such as a processor register.

SUMMARY

This document describes, among other things, technologies relating to hot-plugging debugger architectures. In one aspect, a described processor-chip, e.g., integrated circuit device, includes a processor, a first pad interface, a detector configured to detect a clock signal via the first pad interface, one or more second pad interfaces, two or more components including a debug system that is communicatively coupled with the processor, a multiplexer communicatively coupled with the one or more second pad interfaces and the two or more components, and configured to selectively interconnect the one or more second pad interfaces with a selected component of the two or more components. The multiplexer can be configured to cause the debug system to be the selected component when the clock signal is detected via the first pad interface.

This and other implementations can include one or more of the following features. Implementations can include circuitry to detect an override event associated with a reassignment of the first pad interface. The override event can cause the detector to suspend detection of the clock signal on the first pad interface such that the first pad interface becomes usable as a general purpose input interface, output interface, or both. The one or more second pad interfaces can include two or more pad interfaces. The two or more components includes a general purpose input/output (GPIO) controller that is communicatively coupled with the processor. Implementations can include circuitry configured to generate an override signal to prevent further detection of a debug probe on the first pad interface. Implementations can include circuitry configured to generate an override signal to change an assignment of the first pad interface from the debug system to the GPIO controller; and circuitry configured to register the override signal to maintain the assignment to the GPIO controller. Implementations can include circuitry configured to determine a protection status of a non-volatile memory that is communicatively coupled with the processor; and circuitry configured to cause a generation of the selection signal when the protection status indicates an unprotected state. In some implementations, the first pad interface is connectable with a debug clock signal interface of a debug probe that provides the clock signal, the debug system being responsive to a connection of the debug probe that occurs after the processor-chip has transitioned to an active state.

A hot-plugging debugger system can include a processor, a first pad interface, a detector configured to detect a clock signal via the first pad interface, one or more second pad interfaces, a debug system communicatively coupled with the processor, a GPIO controller communicatively coupled with the processor, a multiplexer communicatively coupled with the one or more second pad interfaces and a group of resources including the debug system and the GPIO controller, the multiplexer being configured to selectively interconnect the one or more second pad interfaces with a selected resource of the group of resources based on a selection signal, and a selector configured to produce the selection signal such that the multiplexer interconnects the one or more second pad interfaces with the debug system when the clock signal is detected via the first pad interface.

A hot-plugging debugger technique can include causing a processor-chip to start-up and transition to an active state without a debug probe attached to a first pad interface of the processor-chip; operating a multiplexer of the processor-chip to selectively interconnect one or more second pad interfaces with two or more components of the processor-chip, the components including a debug system; detecting, when the processor-chip is in the active state, an attachment of the debug probe to the first pad interface by observing a clock signal from the debug probe via the first pad interface; and generating, in response to the attachment, a selection signal that causes the multiplexer to interconnect the one or more second pad interfaces with the debug system.

Particular embodiments of the technology described in this document can be implemented so as to realize one or more of the following advantages. A hot-plugging debugger architecture can allow the activation of a chip-level debug interface after a processor chip is already executing applications and/or firmware. With such an architecture, a debug probe can be attached to a processor chip at any time, including after the chip has been brought-up. One or more described technologies can multiplex pins on the processor chip between debugging and non-debugging proposes. Multiplexing pins on a processor chip can reduce the total number of pins required by the processor chip. One or more described technologies can selectively enable a hot-plugging debugger capability based on a memory protection status, which can provide debugging flexibility to device manufactures during development and/or assembly-line testing and then can be turned-off when shipped to prevent or limit access to a device's firmware.

The details of one or more embodiments of the subject matter described in this document are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
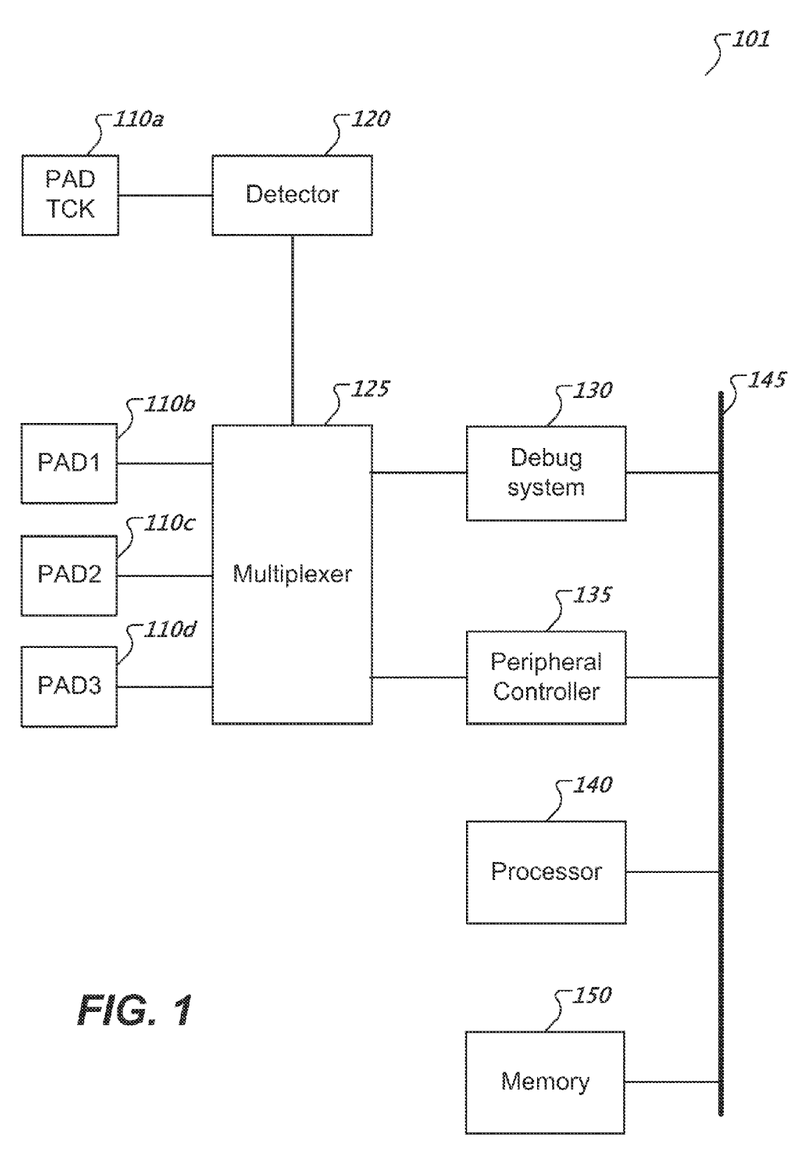
FIG. 1 shows a simplified schematic diagram of an example architecture of an integrated circuit device that provides a hot-plugging debugger capability.

FIG. 1 shows a simplified schematic diagram of an example architecture of an integrated circuit device 101 that provides a hot-plugging debugger capability. The integrated circuit device 101 includes a first pad interface 110a (labeled as PAD TCK), one or more second pad interfaces 110b-d (labeled as PAD1, PAD2, and PAD3 respectively), a detector 120, a multiplexer 125, a debug system 130, a peripheral controller 135, a processor 140, and a memory 150. With the hot-plugging debugger capability, the debug system 130 is responsive to a connection of a debug probe that occurs in cases where the integrated circuit device 101 has already transitioned to an active state. In general, the device 101 can detect a debug probe connection at start-up or in an active state thus allowing for more on-chip debugging (OCD) operations opportunities. The debug system 130 can provide access to one or multiple components of the device 101.

The processor 140 can be communicatively coupled with various components such as the debug system 130 and the peripheral controller 135 via a bus 145. The multiplexer 125 can be communicatively coupled with the second pad interfaces 110b-d. Further, the multiplexer 125 can be communicatively coupled with components such as the debug system 130 and the peripheral controller 135. The multiplexer 125 can be configured to selectively interconnect the one or more second pad interfaces 110b-d with a selected component of the two or more components 130, 135. The multiplexer 125 can be referred to as a port multiplexer (portmux).

A debug probe (not shown) can be attached to the integrated circuit device 101. In some implementations, the debug probe is based on the JTAG standard. Attaching a debug probe can include plugging a debug probe into a debug port that is interconnected with the device 101. The debug probe can include multiple interfaces including a debug clock signal interface that provides a clock signal. Further, the debug probe can include one or more communication interfaces that provide read/write access to the processor 140 via the debug system 130. When attached, the probe's clock interface becomes coupled with the first pad interface 110a and the probe's one or more communication interfaces become coupled with the one or more second pad interfaces 110b-d. In some implementations, an internal clock system (not shown) within the integrated circuit device 101 can be configured to synchronize with the clock signal provided by the debug probe via the first pad interface 110a. In some implementations, the debug probe includes a debug clock signal interface and a bidirectional communication interface that multiplexes two or more debug communication pathways, which in turn, can reduce the number of external interfaces required for the debug system 130.

The detector 120 can be configured to detect a clock signal provided by the debug probe via the first pad interface 110a and provide an indication of a detection to the multiplexer 125. Based on the indication, the multiplexer 125 can be configured to select the debug system 130. Once selected, the multiplexer 125 interconnects the second pad interfaces 110b-d with the debug system 130. In some implementations, the debug system 130 has the highest priority for utilizing the second pad interfaces 110b-d, and accordingly, the use of these interfaces by another component such as the peripheral controller 135 will be disrupted and/or prevented once the debug probe has been detected.

In some implementations, the memory 150 includes a non-volatile memory that can be configured to store firmware for execution on the processor 140. For example, a debug probe can be attached to the integrated circuit device 101 to debug the processor's 140 execution of the firmware. In some cases, a debug probe can be attached to the integrated circuit device 101 to perform one or more test procedures. In some implementations, the integrated circuit device 101 is a microcontroller. In some implementations, the device 101 is deemed to be in an active state if at least one component, such as a system manager or a clock system, of the device 101 is in an active state. In some cases, the processor 140 may be kept in an inactive state for a configurable amount of time after a reset, while the memory 150 is allowed to transition to an active state such that the memory 150 can be programmed without interference from the processor 140.

Figure 2:
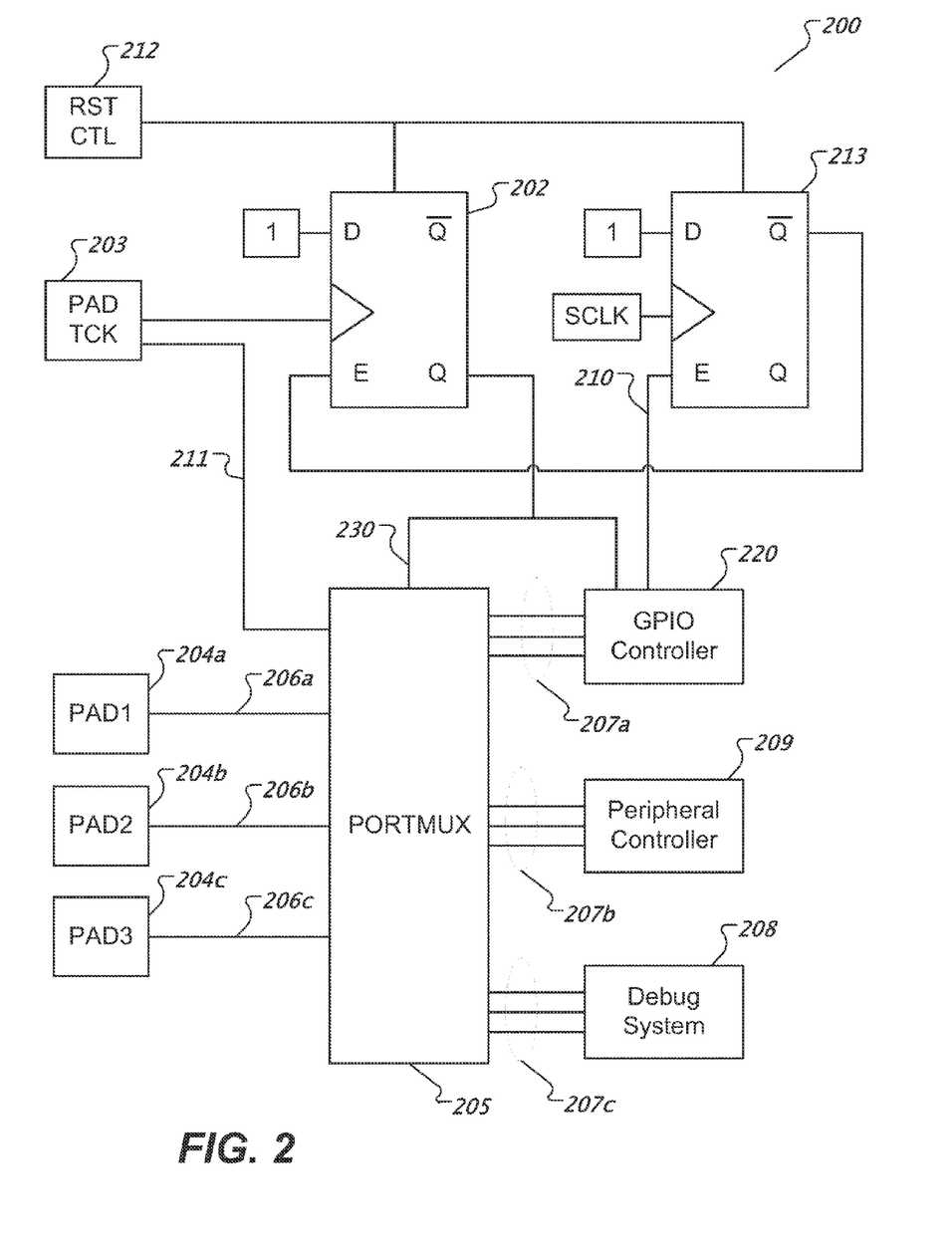
FIG. 2 shows a simplified schematic diagram of another example architecture of an integrated circuit device that provides a hot-plugging debugger capability.

FIG. 2 shows a simplified schematic diagram of another example architecture of an integrated circuit device 200 that provides a hot-plugging debugger capability. In this example architecture, a TCK pad 203 is capable of being multiplexed, e.g., it may be used initially for testing or debugging, and later for something else. After a power-up or a system reset, the TCK pad 203 is initially assigned to the debug system 208. When assigned to the debug system 208, the TCK pad 203 is configured as an input. In some implementations, circuitry within the device 200 can use an incoming clock signal via the TCK pad 203 to synchronize an internal clock system.

The TCK pad 203 can include an internal pull-up mechanism to avoid a high-Z state when no debug probe is connected. A debug probe, such as a JTAG debug probe, can be detected when a falling edge waveform is observed via the TCK pad 203. The debug probe clock signal detector mechanism can include a flip-flop 202 (referred to as the DET flip-flop). The DET flip-flop 202 can be a D-type flip-flop that includes a data "D" input, a clock input, an enable "E" input, a reset input, a Q output, and negated Q output (Q-bar). In this example, the DET flip-flop 202 is clocked on a signal provided by the TCK pad 203, and the D input of the DET flip-flop 202 is fixed at a logical one making the Q output of the DET flip-flop 202 in an active high state (e.g., logical one). Based on this configuration, the detector mechanism can sense a falling edge of a signal provided by the TCK pad 203 when a debug probe is coupled with the TCK pad 203. In some implementations, the detector mechanism is configured to sense a rising edge.

The portmux 205 interconnects first signal groups 206a-c and second signal groups 207a-c. The second signal groups 207a-c are respectively associated with the GPIO controller 220, peripheral controller 209, and the debug system 208. In addition, the portmux 205 can interconnect the signal group 211 associated with the TCK pad 203 with the second signal groups 207a-c. In some implementations, the portmux 205 interconnects additional groups. A signal group is a group of control and data signals required to control a pad. The pads 203, 204a-c can include circuitry to handle input and/or output signals that and is coupled with its respective signal group.

The portmux 205 selects the signal groups 207a-c based on one or more input signals received via the portmux select bus, the input signals can include the Q output of the DET flip-flop 202. In some implementations, the debug system 208 has a higher priority than the GPIO controller 220 and the peripheral controller 209. For example, when the Q output of the DET flip-flop 202 rises, then the portmux 205 interconnects the signal groups 206a-c of the pads 204a-c with the corresponding signal groups 207c of the debug system 208. If any non-debug application was running at this time using these pads 204a-c, its execution may be disrupted since these pads 204a-c will immediately be reassigned to the debug system 208. The debug system 208 uses its signal groups 207c as a debug data in (e.g., TDI), a debug data out (e.g., TDO), and a debug mode select (e.g., TMS). In some implementations, the signal groups 207c for the debug system 208 further includes the signal group 211 associated with the TCK pad 203. Other types of signal groups are possible.

The TCK pad 203 can be multiplexed, with the TCK pad 203 being initially assigned to the debug system 208 after reset. In some implementations, the TCK pad 203 is initially assigned to debug clock logic that is associated with the debug system 208. The hot-plugging debug capability can be disable if the TCK pad 203 is reassigned to a component other than the debug system 208. In some implementations, after such a reassignment, a system reset can restore the assignment to the debug system 208. In some implementations, firmware executed by a processor can cause the TCK pad 203 to be reassigned to the GPIO controller 220 such that the TCK pad 203 is usable as a GPIO pad. For example, the peripheral controller 209 can use the TCK pad 203 to receive or send a communication signal with an external device.

To support TCK pad multiplexing, circuitry such as a flip-flop 213 (referred to as the OVR flip-flop 213) is included in the device 200. The OVR flip-flop 213 can be a D-type flip-flop that includes a data "D" input, a clock input, an enable "E" input, a reset input, a Q output, and negated Q output (Q-bar). A GPIO configuration can be changed to override the initial assignment of TCK pad 203 to the debug system 208 by generating an override event. For example, to indicate a TCK pad debug configuration override, the GPIO controller 220 can output a logical one via an override signal, such as a TCK GPIO enable signal 210, to the E input of the OVR flip-flop 213. The D input of the OVR flip-flop 213 is fixed at a logical one. In some implementations, the clock input of the OVR flip-flop 213 comes from a system clock (SCLK). To prevent potential side effects, the TCK pad debug configuration override is registered by the OVR flip-flop 213 based on detecting an override. Registering an override can maintain an override status until a reset event. Accordingly, based on the negated Q output of the OVR flip-flop 213 being provided to the E input of the DET flip-flop 202, the debug probe detection performed by the DET flip-flop 202 is disabled until the OVR flip-flop 213 is reset.

In some implementations, the GPIO controller 220 can monitor the Q output of the DET flip-flop 202 via signal 230 to determine whether it can override the TCK pad 203 assignment to the debug system 208. In some implementations, the GPIO controller 220 can be configured to only perform an override if the Q output of the DET flip-flop 202 indicates that no debug probe is attached, e.g., a logical zero.

The DET flip-flop 202 and the OVR flip-flop 213 can be reset by a reset signal provided by a reset control (RSTCTL) interface 212. In some implementations, the RSTCTL interface 212 can receive a reset signal from an external source. The reset signal can initialize the flip-flops 202, 213 to a default state such that the Q outputs are a logical zero. In some implementations, a reset signal provided by the RSTCTL interface 212 is generated based on a combination of a power on reset (POR) signal and/or a brown-out detector (BOD) signal in addition to an external reset signal such that the DET flip-flop 202 and the OVR flip-flop 213 are released from a reset state after a power voltage rises above a threshold.

Figure 3:
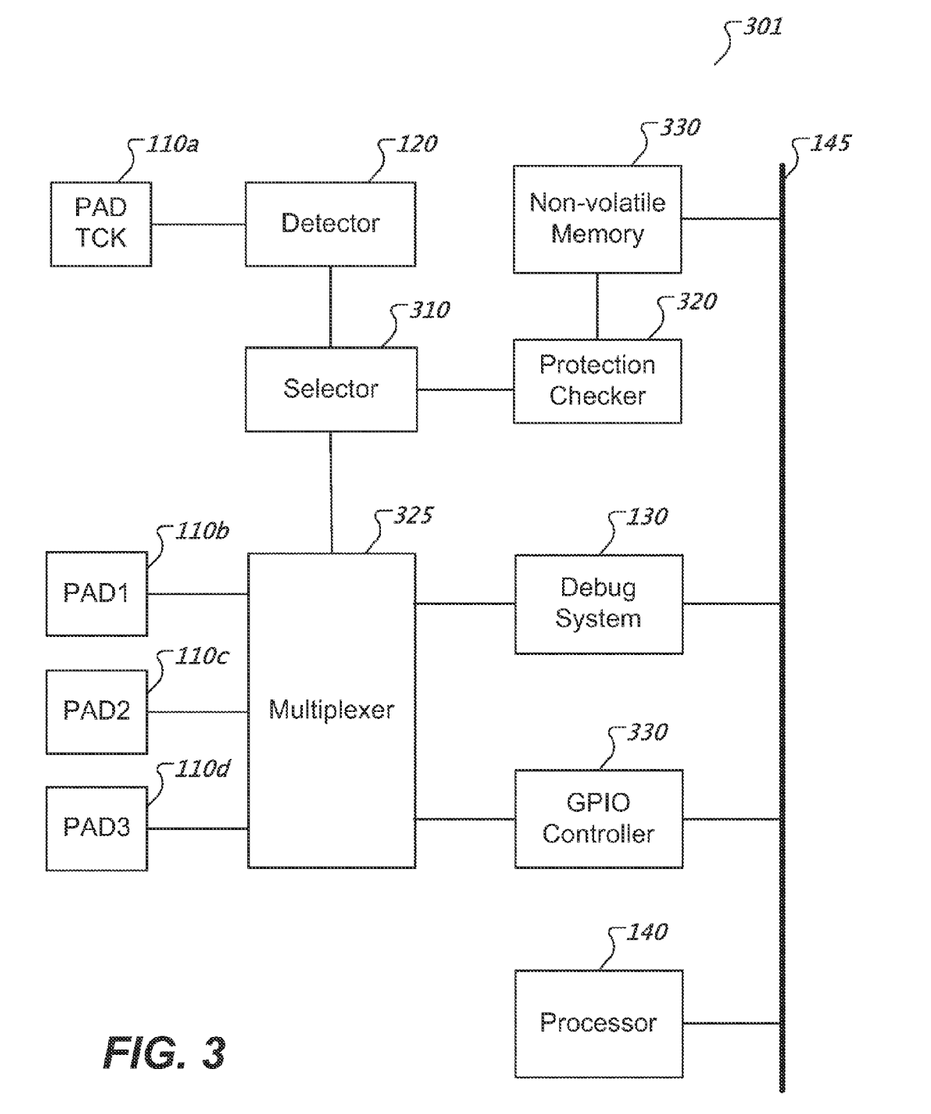
FIG. 3 shows a simplified schematic diagram of an example architecture of a processor system that provides a hot-plugging debugger capability that is responsive to a non-volatile memory protection status.

FIG. 3 shows a simplified schematic diagram of an example architecture of a processor system 301 that provides a hot-plugging debugger capability that is responsive to a non-volatile memory protection status. The processor system 301 includes a first pad interface 100a, one or more second pad interfaces 110b-d, a detector 120, a multiplexer 325, a debug system 130, a GPIO controller 330, a selector 310, a protection checker 320, and a non-volatile memory 330. The multiplexer 325 is communicatively coupled with the one or more second pad interfaces 110b-d and a group of resources including the debug system 130 and the GPIO controller 330. The multiplexer 325 can be configured to selectively interconnect the second pad interfaces 110b-d with a selected resource of the group of resources based on a selection signal 11010b-d provided by a selector 310. The selector 310 can be configured to produce the selection signal such that the multiplexer 325 interconnects the second pad interfaces 110b-d with the debug system 130 when the clock signal is detected via the first pad interface 110a.

The protection checker 320 can query the non-volatile memory 330 regarding a protection status of the non-volatile memory 330. The protection status can indicate either a protected state or an unprotected state. If the protection status indicates a protected state, then the protection checker 320 can cause the selector 310 to ignore any clock signal detection events generated by the detector 120. If the protection status indicates an unprotected state, then the protection checker 320 can cause the selector 310 to handle a clock signal detection event generated by the detector 120. In some implementations, the system 301 can be placed into a debug mode regardless of the protection status if a debug probe is attached before the system 301 is powered-on or reset. In some implementations, the system 301 can be fabricated as a system-on-a-chip (SoC) with the non-volatile memory 330 residing on the SoC. In some other implementations, the a majority of the system 301 can be fabricated as a SoC except that the non-volatile memory 330 does not reside on the SoC, but is externally coupled with the SoC.

Figure 4:
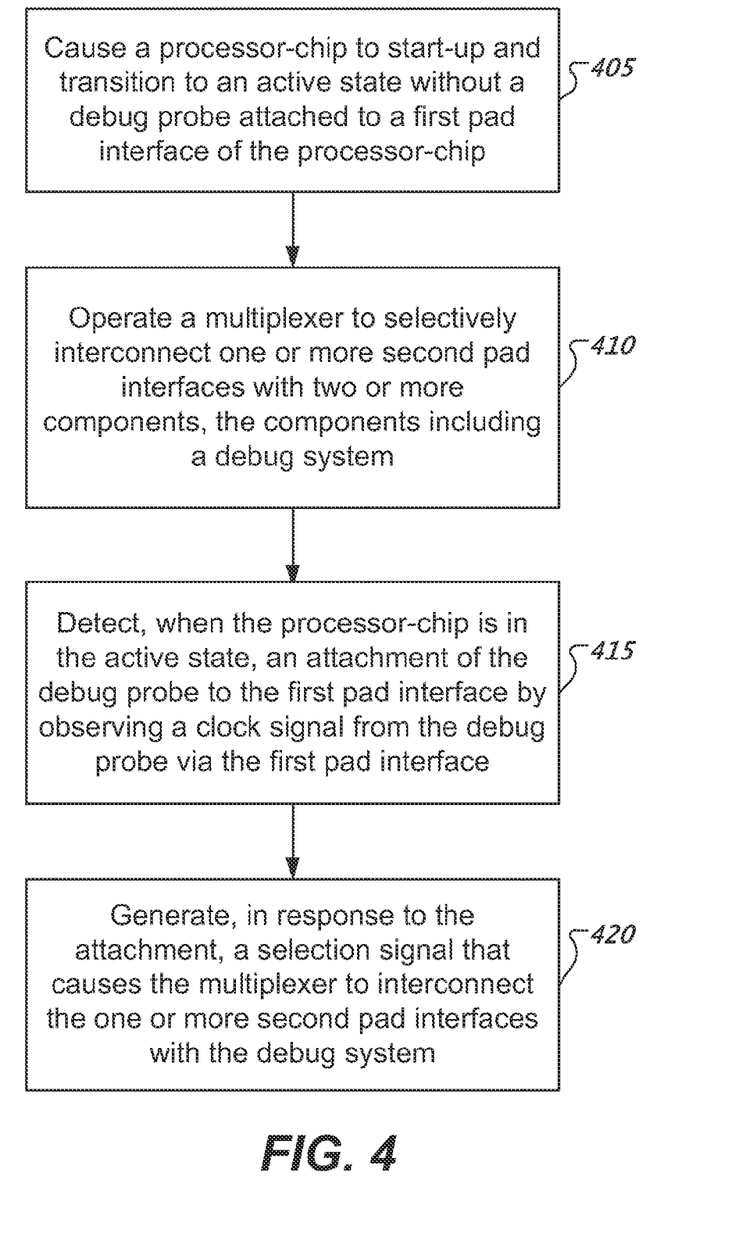
FIG. 4 shows a flowchart of an example process associated with a hot-plugging debugger architecture.

FIG. 4 shows a flowchart of an example process associated with a hot-plugging debugger architecture. At 405, the process causes a processor-chip to start-up and transition to an active state without a debug probe attached to a first pad interface of the processor-chip. Causing the processor-chip to start-up can include providing a voltage source to a processor-chip component such as a system manager or a clock system. In some implementations, causing the processor-chip to start-up can include determining when a core voltage level has stabilized to an appropriate level for a processor start-up, and allowing the processor to start-up once stabilized. At 410, the process operates a multiplexer to selectively interconnect one or more second pad interfaces with two or more components, the components including a debug system. In some implementations, the processor can configure one or more interconnections within the multiplexer by writing to a register that controls the interconnections. At 415, the process detects, when the processor-chip is in the active state, an attachment of the debug probe to the first pad interface by observing a clock signal from the debug probe via the first pad interface. Detecting an attachment of the debug probe can include operating circuitry that transitions based on a failing or rising edge of a waveform. At 420, the process generates, in response to the attachment, a selection signal that causes the multiplexer to interconnect the one or more second pad interfaces with the debug system.

In some implementations, a hot-plugging debugger process can include generating an override signal to prevent further detection of a debug probe on the first pad interface. The process can include operating, in response to the override signal, the multiplexer to interconnect the first pad interface with a GPIO controller. The process can include registering the override signal to maintain the assignment to the GPIO controller. The process can include operating the GPIO controller to generate the override signal. In some implementations, the override signal disables debug probe detection circuitry. In some implementations, a processor executing firmware can control a GPIO controller to generate the override signal.

Figure 5:
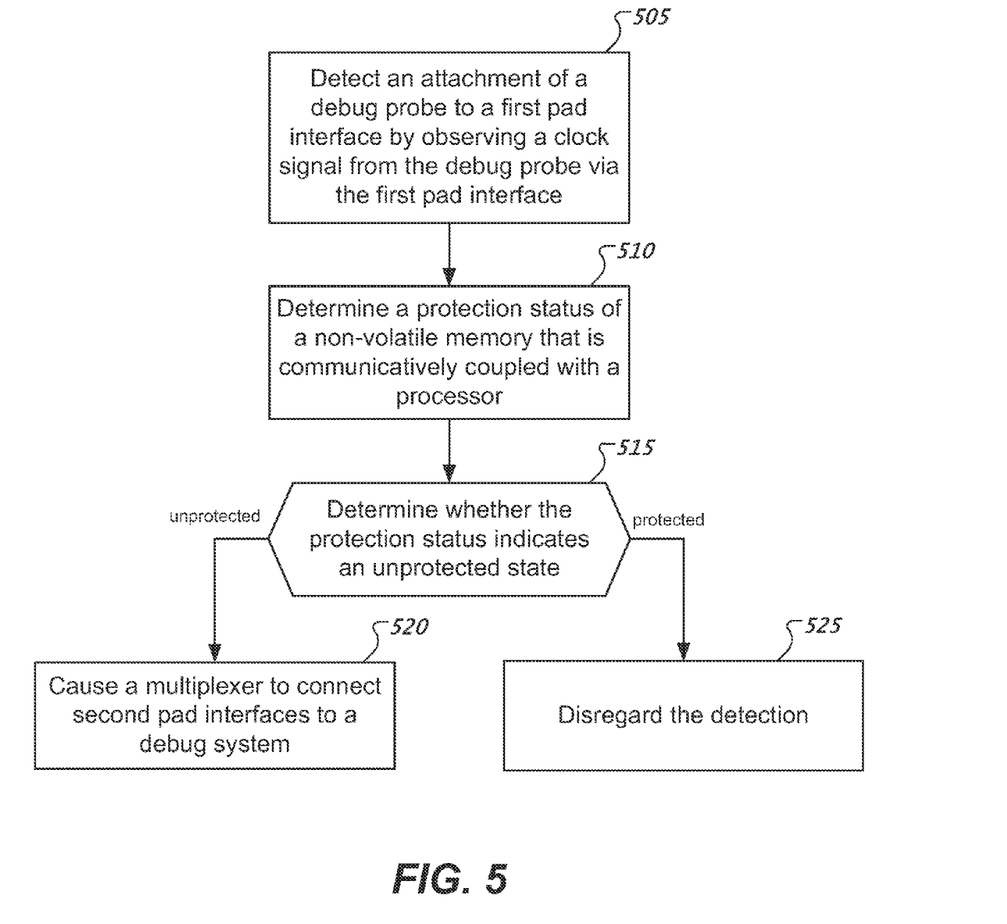
FIG. 5 shows a flowchart of an example process that utilizes a non-volatile memory protection status.

FIG. 5 shows a flowchart of an example process that utilizes a non-volatile memory protection status. At 505, the process detects an attachment of a debug probe to a first pad interface by observing a clock signal from the debug probe via the first pad interface. At 510, the process determines a protection status of a non-volatile memory that is communicatively coupled with a processor. Determining a protection status of a non-volatile memory can include reading a protection bit within the non-volatile memory. At 515, the process determines whether the protection status indicates an unprotected state. Determining whether the protection status indicates an unprotected state can include comparing a status value with a predetermined value that is associated with a protection state. If the protection status indicates an unprotected state, then at 520, the process causes a multiplexer to connect second pad interfaces to a debug system. If the protection status indicates a protected state, then at 525, the process disregards the detection of a debug probe attachment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An integrated circuit apparatus comprising:
a processor,
a first pad interface;
a detector configured to detect a clock signal via the first pad interface;
one or more second pad interfaces;
two or more components including a debug system that is communicatively coupled with the processor; and
a multiplexer communicatively coupled with the one or more second pad interfaces and the two or more components, and configured to selectively interconnect the one or more second pad interfaces with a selected component of the two or more components,
wherein the multiplexer is configured to cause the debug system to be the selected component when the clock signal is detected via the first pad interface.

2. The apparatus of claim 1, further comprising:
circuitry to detect an override event associated with a reassignment of the first pad interface, wherein the override event causes the detector to suspend detection of the clock signal on the first pad interface such that the first pad interface becomes usable as a general purpose input interface, output interface, or both.

3. The apparatus of claim 1, wherein the one or more second pad interfaces include two or more pad interfaces.

4. The apparatus of claim 1, wherein the two or more components includes a general purpose input/output (GPIO) controller that is communicatively coupled with the processor.

5. The apparatus of claim 4, further comprising:
circuitry configured to generate an override signal to change an assignment of the first pad interface from the debug system to the GPIO controller; and
circuitry configured to register the override signal to maintain the assignment to the GPIO controller.

6. The apparatus of claim 1, further comprising:
circuitry configured to determine a protection status of a non-volatile memory that is communicatively coupled with the processor; and
circuitry configured to cause a generation of the selection signal when the protection status indicates an unprotected state.

7. The apparatus of claim 1, wherein the first pad interface is connectable with a debug clock signal interface of a debug probe that provides the clock signal, and wherein the debug system is responsive to a connection of the debug probe that occurs after the apparatus has transitioned to an active state.

8. A system comprising:
a processor,
a first pad interface;
a detector configured to detect a clock signal via the first pad interface;
one or more second pad interfaces;
a debug system communicatively coupled with the processor;
a general purpose input/output (GPIO) controller communicatively coupled with the processor;
a multiplexer communicatively coupled with the one or more second pad interfaces and a group of resources including the debug system and the GPIO controller, wherein the multiplexer is configured to selectively interconnect the one or more second pad interfaces with a selected resource of the group of resources based on a selection signal; and
a selector configured to produce the selection signal such that the multiplexer interconnects the one or more second pad interfaces with the debug system when the clock signal is detected via the first pad interface.

9. The system of claim 8, further comprising:
circuitry to detect an override event associated with a reassignment of the first pad interface, wherein the override event causes the detector to suspend detection of the clock signal on the first pad interface such that the first pad interface becomes usable as a general purpose input interface, output interface, or both.

10. The system of claim 9, wherein the GPIO controller generates the override event.

11. The system of claim 9, wherein the first pad interface is connectable with a debug clock signal interface of a debug probe that provides the clock signal, and wherein the debug system is responsive to a connection of the debug probe that occurs after the system has transitioned to an active state.

12. The system of claim 8, wherein the one or more second pad interfaces include two or more pad interfaces.

13. The system of claim 8, further comprising:
circuitry configured to generate an override signal to change an assignment of the first pad interface from the debug system to the GPIO controller; and
circuitry configured to register the override signal to maintain the assignment to the GPIO controller.

14. The system of claim 8, further comprising:

a non-volatile memory configured to store instructions for execution on the processor;

circuitry configured to determine a protection status of the non-volatile memory; and circuitry configured to cause a generation of the selection signal when the protection status indicates an unprotected state.

15. A method comprising:

causing a processor-chip to start-up and transition to an active state without a debug probe attached to a first pad interface of the processor-chip;

operating a multiplexer of the processor-chip to selectively interconnect one or more second pad interfaces with two or more components of the processor-chip, the components including a debug system;

detecting, when the processor-chip is in the active state, an attachment of the debug probe to the first pad interface by observing a clock signal from the debug probe via the first pad interface; and generating, in response to the attachment, a selection signal that causes the multiplexer to interconnect the one or more second pad interfaces with the debug system.

16. The method of claim 15, further comprising:

generating an override signal to prevent further detection of a debug probe on the first pad interface.

17. The method of claim 16, further comprising:

operating, in response to the override signal, the multiplexer to interconnect the first pad interface with a general purpose input/output (GPIO) controller; and registering the override signal to maintain the assignment to the GPIO controller.

18. The method of claim 17, further comprising:

operating the GPIO controller to generate the override signal.

19. The method of claim 15, further comprising:

determining a protection status of a non-volatile memory that is communicatively coupled with the processor, and causing the generating of the selection signal when the protection status indicates an unprotected state.

20. The method of claim 15, wherein the first pad interface is connectable with a debug clock signal interface of a debug probe that provides the clock signal, and wherein the debug system is responsive to a connection of the debug probe that occurs after the processor-chip has transitioned to the active state.

\* \* \* \* \*